United States Patent [19]
Ong

[11] Patent Number: 5,289,026
[45] Date of Patent: Feb. 22, 1994

[54] ASYMMETRIC FLOATING GATE OVERLAP FOR IMPROVED DEVICE CHARACTERISTICS IN BURIED BIT-LINE DEVICES

[75] Inventor: Tong-Chern Ong, San Jose, Calif.

[73] Assignee: Intel Corporation, Santa Clara, Calif.

[21] Appl. No.: 744,969

[22] Filed: Aug. 14, 1991

[51] Int. Cl.$^5$ .................. H01L 29/68; H01L 29/78
[52] U.S. Cl. .................. 257/316; 257/317; 257/321
[58] Field of Search ............... 257/314, 315, 316, 317, 257/321; 365/185

[56] References Cited

U.S. PATENT DOCUMENTS

| | | | |
|---|---|---|---|
| 4,698,787 | 10/1987 | Mukherjee | 365/185 |
| 4,780,424 | 10/1988 | Holler | 437/29 |
| 5,028,979 | 7/1991 | Mazzali | 257/316 |

Primary Examiner—Ngan Ngo
Attorney, Agent, or Firm—Blakely, Sokoloff, Taylor & Zafman

[57] ABSTRACT

An electrically erasable non-volatile EPROM memory device having an asymmetric floating gate with respect to a buried source region and a buried drain region is disclosed. A patterned floating gate member is formed over a portion of the source region and a portion of the drain region producing a floating gate-to-source overlap and a floating gate-to-drain overlap, respectively, such that the floating gate-to-source overlap is less than the floating gate-to-drain overlap.

6 Claims, 3 Drawing Sheets

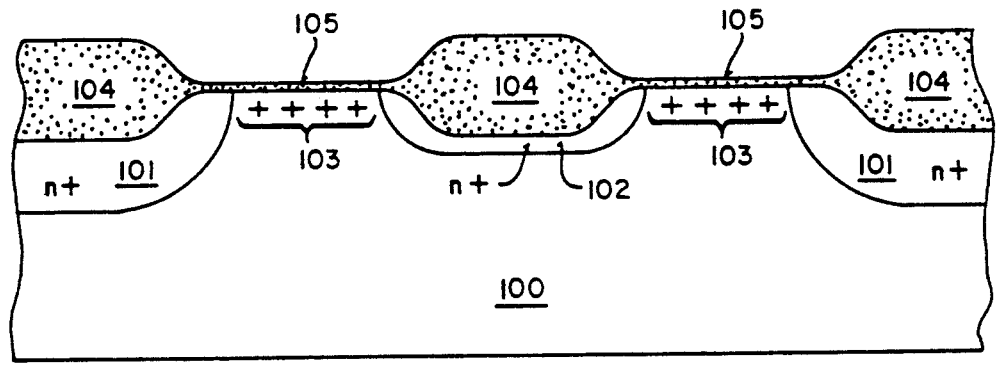
FIG_1
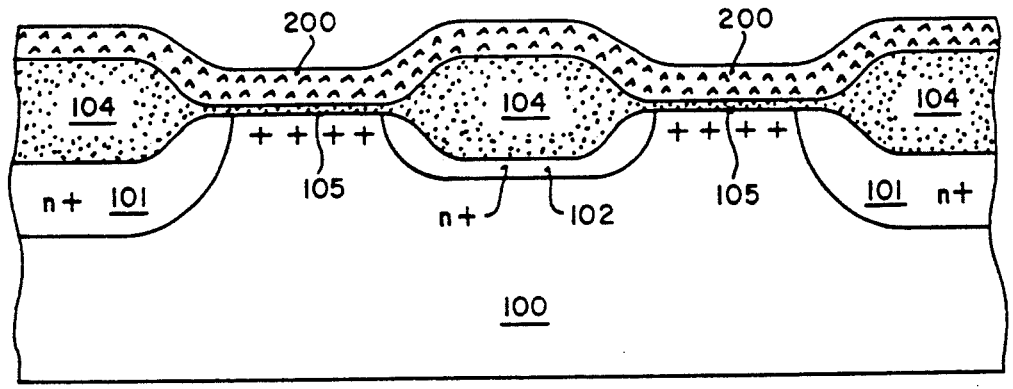
FIG_2
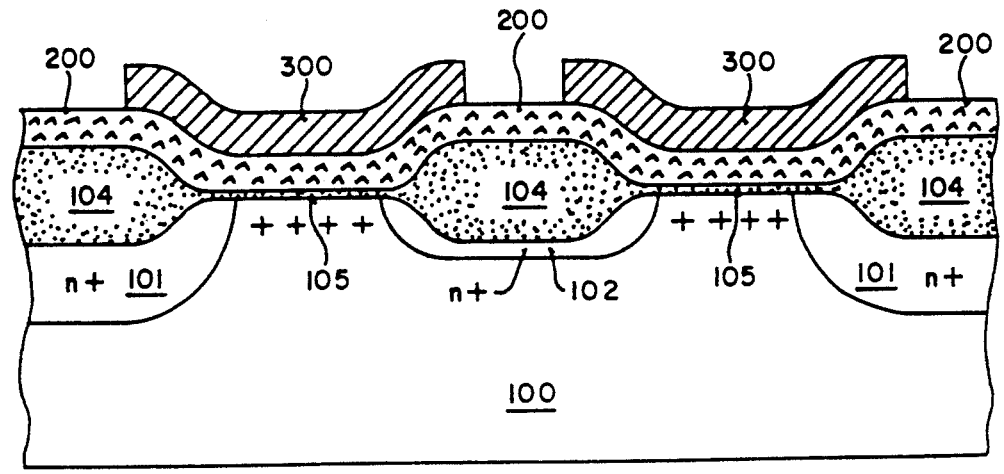
FIG_3 (PRIOR ART)

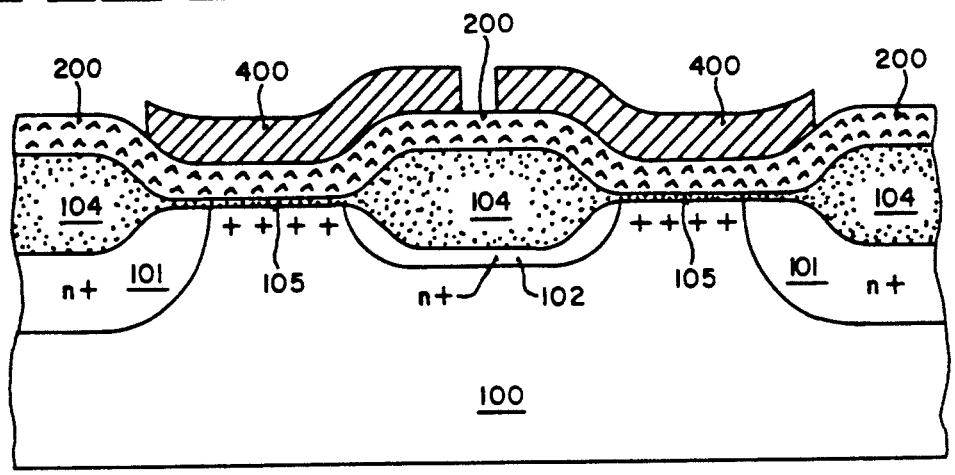
FIG_4
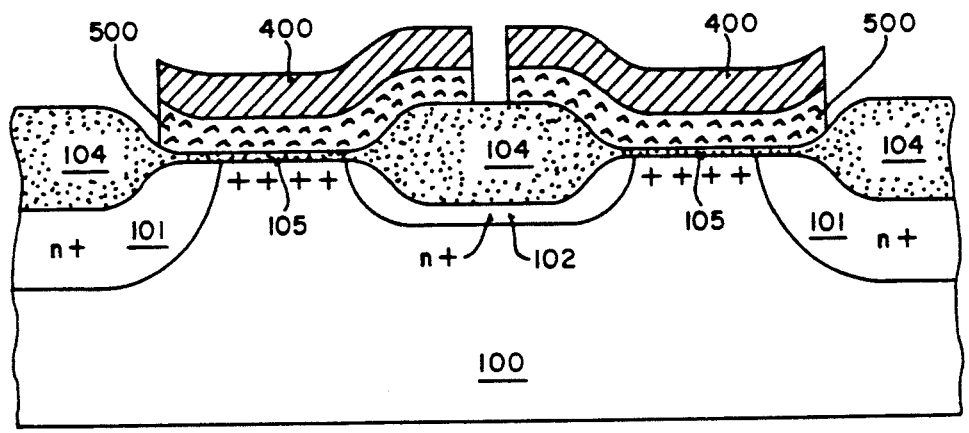
FIG_5
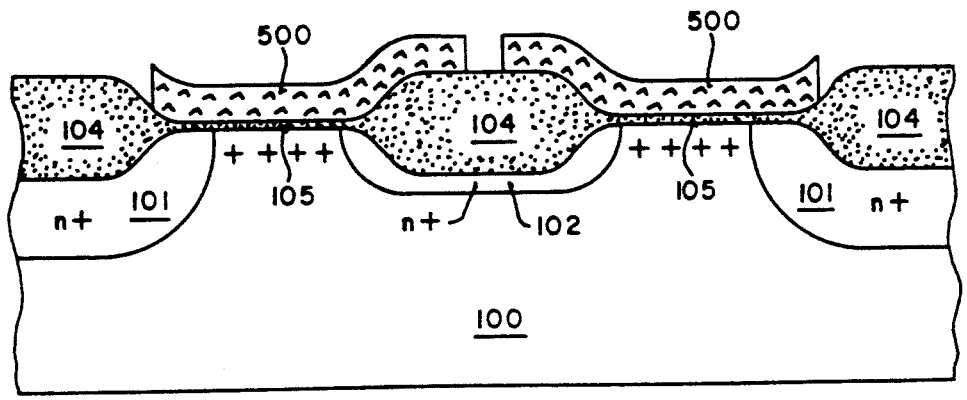
FIG_6

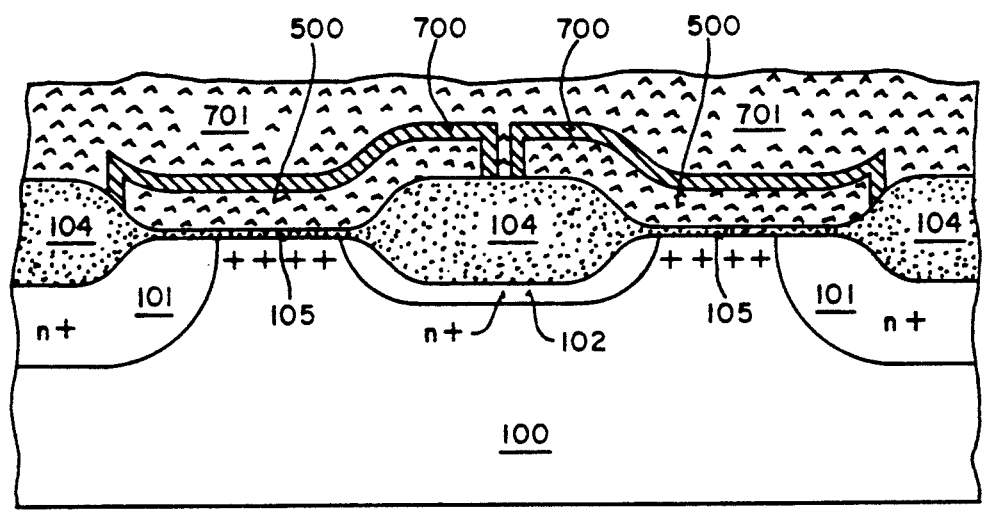

ASYMMETRIC FLOATING GATE OVERLAP FOR IMPROVED DEVICE CHARACTERISTICS IN BURIED BIT-LINE DEVICES

FIELD OF THE INVENTION

The present invention relates generally to the field of semiconductor devices, and in particular, to non-volatile memory devices having floating gates that are electrically erased through a source region of a metal oxide semiconductor device.

BACKGROUND OF THE INVENTION

An electrically programmable read only memory (EPROM) is a type of device having a floating gate member that is either charged or uncharged. Once charged, the electrons within the floating gate member in many EPROM devices are removed by ultraviolet light or a Fowler-Nordheim tunneling process. The tunneling erase process is usually referred to as "electrical erase". For some types of EPROM devices, the electrical erase is achieved by disconnecting the drain, grounding the control gate, and taking the source to a sufficiently positive potential, typically between 10 V and 20 V, to remove the charge from the floating gate member. An example to this kind of device is disclosed in U.S. Pat. No. 4,780,424. The process of erasing causes electrons to flow from the floating gate member to the source region through a tunnel oxide layer (a thin silicon dioxide layer) between the source region and the floating gate member. The rate at which electrons are removed from the floating gate member is determined by the potential across the tunnel oxide layer during erase. A higher potential across the tunnel oxide layer increases the rate at which electrons are removed from the floating gate producing a device with a shorter erase time.

Traditionally, the floating gate member overlaps the source region and drain region nearly symmetrically for many devices including a device disclosed in U.S. Pat. No. 4,780,424. With a symmetric floating gate member, a change in the overlap affects the charging, erasing, and reading characteristics of the device. A smaller floating gate overlap affects both the source and drain overlap on symmetrical devices. The device has less source coupling and increases the potential across the tunnel oxide during erase thereby causing the floating gate member to erase faster. The device also has less drain coupling giving a smaller floating gate potential during programming and a smaller read current, both of which are not desired. A larger floating gate overlap increases the floating gate-to-source overlap and the floating gate-to-drain overlap. A device with the larger floating gate overlap has better programming characteristics and more read current, but has a slower erase time. Therefore, the symmetric overlap does not produce optimum device performance because the floating gate overlap of the source and drain regions are not changed independently of one another.

Several types of asymmetric single cell EPROM devices are disclosed in U.S. Pat. No. 4,698,787. A single cell requires contacts to the source, drain, and control gate. When incorporated into a memory array, a significant amount of array area is occupied by contacts to the individual source, drain, and control gates. This type of cell layout decreases yield as the number of devices per substrate, and each device has a greater likelihood of failure because it occupies more substrate area.

SUMMARY OF THE INVENTION

In view of the foregoing, it is an object of the present invention to increase the potential across the tunnel oxide layer during erasing thereby reducing the erase time of the device.

It is an additional object of the present invention to increase the read current thereby reducing the read access time of the device.

It is yet another objective to form a device having better erase, programming, and read characteristics using a contactless array.

It is a further object of the present invention to reduce the erase time and increase the read current of the device while maintaining an uncomplicated and reliable manufacturing process.

As will be described in more detail hereinafter, the present invention resides in forming a buried bit-line EPROM device having an asymmetric overlap of the floating gate member over the source region and the drain region. A device produced in accordance with the present invention has a faster combination of erase time and read access time compared to a device where the floating gate member is symmetric with respect to the source region and the drain region.

Spaced-apart first regions are heavily doped with a dopant of a type opposite that of a monocrystalline silicon layer to form a source region and a drain region within the monocrystalline silicon layer on a semiconductor substrate. Self-aligned thick silicon dioxide (SATO) areas are grown from the monocrystalline silicon layer over the source and drain regions. A high quality tunnel oxide layer is grown between the SATO areas and is over a second region that is between the spaced-apart first regions. A floating gate member is formed so that it overlaps a portion of the source region and a portion of the drain region and forms a floating gate-to-source overlap and a floating gate-to-drain overlap, respectively, such that the floating gate-to-source overlap is less than the floating gate-to-drain overlap. The device is further processed to form a finished device including an intergate insulating layer and a patterned control gate layer.

BRIEF DESCRIPTION OF THE DRAWINGS

FIG. 1 is a cross sectional view of a portion of a substrate using a buried bit-line EPROM process after forming a tunnel oxide layer.

FIG. 2 is the substrate in FIG. 1 after depositing a floating gate layer.

FIG. 3 is the substrate in FIG. 2 after a prior art method of forming a floating gate masking pattern.

FIG. 4 is the substrate in FIG. 3 after forming a floating gate masking pattern in accordance with the currently preferred embodiment of the present invention.

FIG. 5 is the substrate in FIG. 4 after etching the floating gate layer to form floating gate members in accordance with the currently preferred embodiment of the present invention.

FIG. 6 is the substrate in FIG. 5 after removing the floating gate masking pattern.

FIG. 7 is the substrate in FIG. 6 after an intergate insulating layer and a control gate layer are formed.

DETAILED DESCRIPTION OF THE PRESENT INVENTION

The invention disclosed herein includes a method of making an electrically erasable non-volatile memory device and the device itself. The present invention is used to form a floating gate member that overlaps a portion of a buried source region and a portion of a buried drain region creating a floating gate-to-source overlap and a floating gate-to-drain overlap, respectively, such that the floating gate-to-source overlap is less than the floating gate-to-drain overlap. Device performance can be optimized better than a device with a symmetric floating gate member because the floating gate-to-source overlap can be changed independently from the floating gate-to-drain overlap. The currently preferred embodiment forms a buried bit-line flash EPROM cell. The present invention forms a device using a 0.8 μm sized technology, but devices using other sized technologies may use the present invention.

FIG. 1 illustrates a portion of a substrate having a memory array prior to depositing a floating gate layer. The substrate includes a lightly p-type doped monocrystalline silicon layer 100. Within the layer 100 are heavily n-type doped regions that are source regions 101 and a drain region 102. Over the source regions 101 and the drain region 102 are self-aligned thick silicon dioxide (SATO) areas 104 about 1500 Å thick. The SATO areas 104 are a type of field oxide layer used within the memory array to electrically isolate adjacent memory cells. The SATO areas 104 over the source regions 101 and the drain region 102 are used to form a contactless array with buried bit lines. Channel regions 103 within layer 100 are formed between the source regions 101 and the drain region 102. The channel regions 103 are doped to adjust the threshold voltage and channel punchthrough voltage of the memory cells within the array. A high quality thin tunnel oxide layer 105 comprising silicon dioxide is grown from the layer 100 to about 110 Å thick and is formed between the SATO areas 104. The steps required to form the device prior to the floating gate layer are described in U.S. Pat. No. 4,780,424 issued to Holler which is herein incorporated by reference and referred to as Holler.

In the currently preferred embodiment, the substrate is deposited with a polycrystalline silicon (polysilicon) layer about 1800 Å thick. The polysilicon layer is heavily doped using ion implantation with phosphorus ions to a dose of about 5E14 ions/cm$^2$ to form a floating gate layer 200 in FIG. 2. The substrate is coated with a photoresist layer about 1 μm thick. FIG. 3 illustrates the prior art method of patterning the photoresist layer to form photoresist members 300 that are generally symmetric about the source regions 101 and the drain region 102. In accordance with the currently preferred embodiment, the photoresist layer is patterned to form photoresist members 400 that are asymmetric about the source regions 101 and the drain region 102 as shown in FIG. 4. Each photoresist member overlaps a portion of a source region 101 by about 0.2 μm and overlaps a portion of the drain region 102 by about 0.7 μm, as well as, the entire channel region 103.

The floating gate layer is anisotropically etched to form floating gate members 500 as illustrated in FIG. 5. The floating gate layer 200 etches similar to a polysilicon layer having about the same doping concentration as the floating gate layer 200. In the currently preferred embodiment, the length, width, and height of the floating gate members 500 are nearly equivalent to those of the prior art, but the floating gate members' position over each cell has been shifted towards the drain region 101 and away from the source region 102 by a few tenths of a micron. The photoresist layer is removed using plasma ashing or a mixture of hot sulfuric acid and hydrogen peroxide to produce the substrate as shown in FIG. 6.

Referring to FIG. 7, an intergate insulating layer 700 is formed over each of the photoresist members 500. The intergate insulating layer 700 includes a silicon dioxide film over a silicon nitride film over a silicon dioxide film. The insulating layer 700 is sometimes called the ONO layer due to its oxide-nitride-oxide composition. A control gate member 701 comprising doped polysilicon is formed in a strip that is substantially perpendicular to the source regions 101 and the drain region 102. FIG. 7 illustrates the substrate after the control gate member 701 has been formed. After formation of the substrate shown in FIG. 7, processing steps are used to make a finished device including an electrically insulating glass layer, a metalization layer, and a passivation layer. The processing steps starting with the formation of the intergate insulating layer 700 use the process sequence disclosed in Holler.

Alternate embodiments to the currently preferred embodiment may be used without departing from the scope or spirit of the invention. The floating gate members may be comprised of amorphous silicon or one or more layers of polysilicon or amorphous silicon. For simplicity, these varying types of materials used for the floating gate are hereinafter referred to as polysilicon. The total thickness of the floating gate layer 200 is in the range of about 1200 Å to about 2000 Å thick. Alternate embodiments may use other methods to form a conductive floating gate including furnace doping in addition to ion implantation, doping with any p-type or n-type dopant, or siliciding the floating gate. When ion implantation uses a n-type dopant, the floating gate members are doped with a dose between about 3E14 ions/cm$^2$ to about 8E14 ions/cm$^2$.

As the floating gate-to-source overlap is reduced, the source coupling is also reduced. The reduced source coupling increases the potential across the tunnel oxide layer producing a shorter erase time for a memory cell and especially for an array of flash memory cells. If the floating gate member 500 does not overlap the source regions 101 at all, the memory cell does not function properly. Current photoresist patterning techniques have misalignment tolerances of about 0.1 μm or more. The floating gate-to-source overlap should be between about 0.1 μm and about 0.5 μm. The overlap may get below 0.1 μm as improvements regarding misalignment tolerances are made.

The floating gate-to-drain overlap is governed by desired memory cell programming and read characteristics. Increasing the floating gate-to-drain overlap increases the drain coupling and results in a shorter read access time, but the floating gate-to-drain overlap may be limited. To illustrate the limitation more clearly, assume a memory cell has a drain coupling ratio of 0.1. A drain potential of 7 V induces a 0.7 volt increase of potential on the floating gate because the increase of potential is the product of the drain voltage and the drain coupling ratio and is independent of the control gate voltage. The drain voltage required to turn on a memory cell with the control gate at ground potential is often referred to as the "drain turn-on voltage". If the floating gate-to-drain overlap is too large, the drain turn-on voltage will be reduced. If the drain turn-on voltage becomes smaller than the drain voltage during programming, an unselected cell turns on when a selected cell in the same column is being programmed. This result is not desired because a large amount of current can flow through all of the unselected cells in the same column and pull down the drain voltage during programming. The programming performance is degraded because the column voltage during programming may become clamped to the drain turn-on voltage regardless of how high a voltage is applied to the column.

Larger drain coupling reduces the voltage required to program the floating gate produces a memory cell with a shorter programming time. Once again, the increased floating gate-to-drain overlap may be limited. If the overlap is too large, a small voltage applied to the drain of a memory cell may cause the device to turn on even though the control gate is grounded because the floating gate potential becomes higher due to the voltage coupling between the drain and the floating gate. In addition, too much overlap may cause floating gates members from adjacent memory cells to contact each other over a drain thereby shorting the floating gate members to one another.

Because of the tradeoffs, one may decide which device concerns are more important and design the floating gate-to-drain overlap accordingly. The floating gate-to-drain overlap is generally between 0.5 μm and about 0.9 μm.

Other alternate embodiments may be used. Isotropic etching of the floating gate layer may be used although isotropic methods are generally more difficult to dimensionally control. In the future, it may be possible to deposit a patterned floating gate layer, thereby making the photoresist patterning and etching obsolete. A deposition system that deposits a patterned floating gate layer must be capable of forming a floating gate member having floating gate-to-source and floating gate-to-drain overlaps as previously discussed.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. An array of electrically erasable non-volatile memory devices comprising:
   a monocrystalline silicon layer including a plurality of buried source regions and a plurality of buried drain regions, said source regions and said drain regions alternating and spaced apart, wherein said drain regions are shared by adjacent ones of said memory devices in said array;
   wherein each of said memory devices comprises:
   field oxide areas over the source region and the drain region;
   a floating gate member overlapping a portion of the source region and a portion of the drain region forming a floating gate-to-source overlap and a floating gate-to-drain overlap, respectively, such that the floating gate-to-source overlap is less than the floating gate-to-drain overlap;
   an insulating layer; and
   a control gate member.

2. The device of claim 1, wherein the floating gate-to-drain overlap is no greater than about 0.9 μm.

3. The device of claim 2, wherein the floating gate-to-source overlap is no greater than about 0.5 μm.

4. The device of claim 3, wherein the floating gate member is between about 1200 Å and about 2000 Å thick.

5. The device of claim 1 wherein the floating gate-to-source overlap is no greater than about 0.5μ.

6. The device of claim 1 wherein floating gate-to-drain overlap is between approximately 0.5μ and 0.9μ and the floating gate-to-source overlap is between approximately 0.1μ and 0.5μ.

* * * * *